United States Patent [19]
Prodel

[11] 4,097,108
[45] Jun. 27, 1978

[54] HOT LINE CLAMPS

[75] Inventor: Marcel Prodel, Arnac Pompadour, France

[73] Assignee: Sicame, Arnac Pompadour, France

[21] Appl. No.: 772,955

[22] Filed: Feb. 28, 1977

Related U.S. Application Data

[63] Continuation of Ser. No. 546,753, Feb. 3, 1975, abandoned.

[51] Int. Cl.² .......................................... H01R 13/00
[52] U.S. Cl. ...................................... 339/109; 85/62; 339/264 R
[58] Field of Search ............. 85/62; 339/109, 108 R, 339/75 R, 110 R, 264 R, 264 L

[56] References Cited
U.S. PATENT DOCUMENTS

| | | | |
|---|---|---|---|
| 2,120,447 | 6/1938 | Tipsord | 339/264 L |
| 3,177,459 | 4/1965 | Toedtman | 339/109 |
| 3,624,592 | 11/1971 | Walter | 339/109 |

Primary Examiner—Roy Lake
Assistant Examiner—DeWalden W. Jones
Attorney, Agent, or Firm—Young & Thompson

[57] ABSTRACT

A hot line clamp for temporarily or permanently connecting a branch conductor to a main conductor. The clamp includes a rigid generally U-shaped body with a cylindrical boss for receiving the branch conductor. The branch line is secured in place on the ground by the lineman. The clamp also includes a flap member which is rockably mounted about one leg of the U-shaped body between an open position for enabling the clamp to be received on the main conductor and a closed position for maintaining the clamp in place on the main conductor. A torsion spring is disposed around the pivot for the flap member and biases the latter toward the open position. The edges of flanges on flap member cooperate with the main conductor when the clamp is received thereon for rocking the flap member to the closed position. An eye bolt is threadedly received in one of the legs of the body for tightening and loosening the hold of the clamp on the main conductor, the head of the bolt being adapted to receive the hook of an insulated pole. The weight of the pole itself is enough to rock the flap member into its closed position where holes therein engage dogs on the body. A pin having a predetermined shear strength is connected between the bolt per se and its head. Accordingly, when the tightening torque exerted by the lineman on the bolt exceeds a limit corresponding to the shear strength of the pin, the latter is sheared. The clamp with its pin sheared in this manner may be left as is indefinitely. A second pin is provided having a slightly greater shear strength than the first for loosening the bolt should the first pin be accidentally sheared.

8 Claims, 6 Drawing Figures

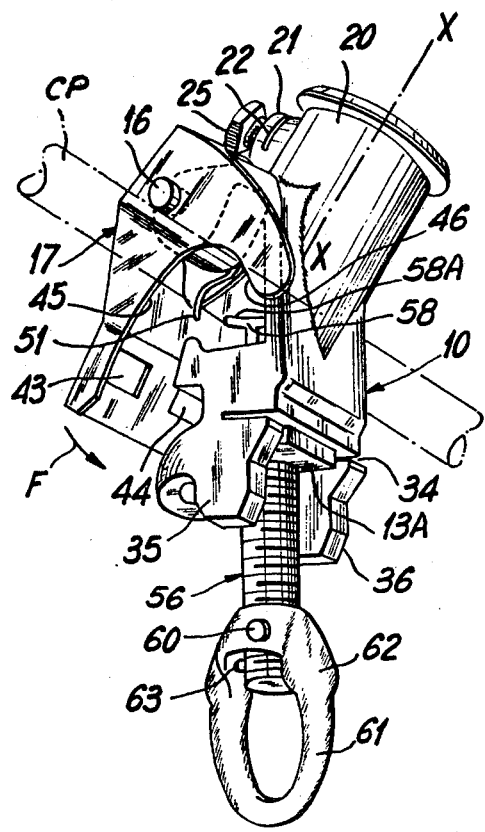
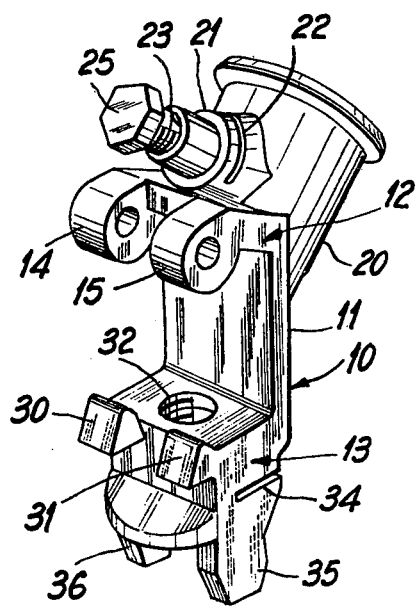
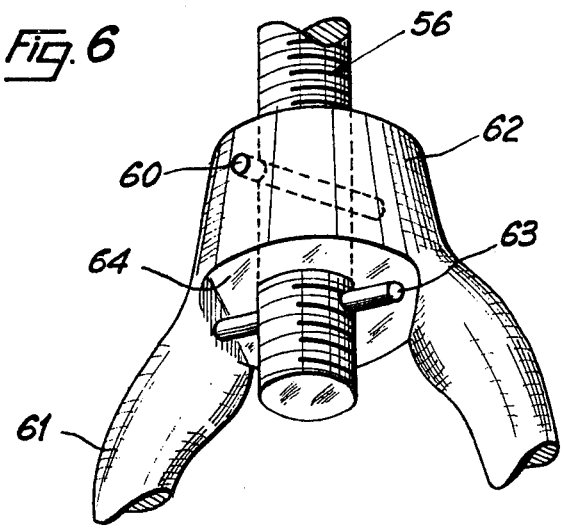

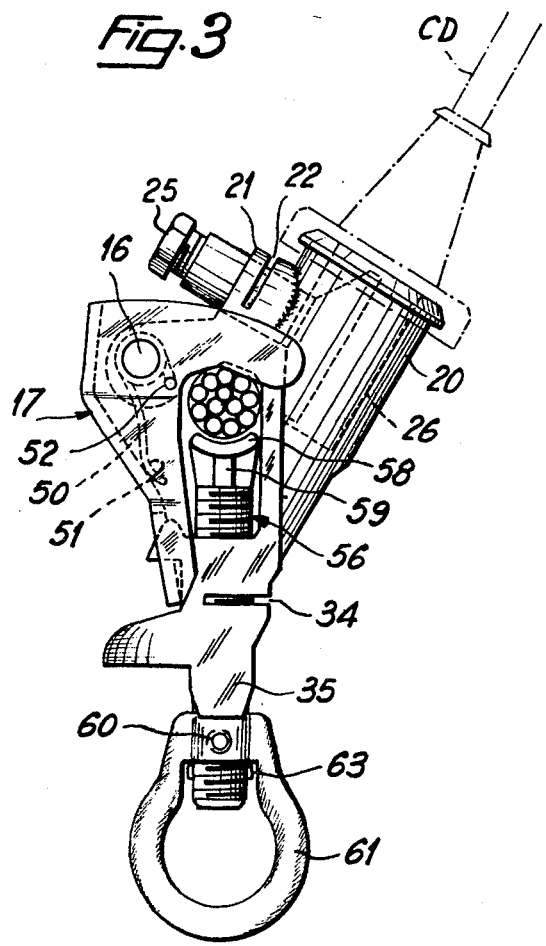
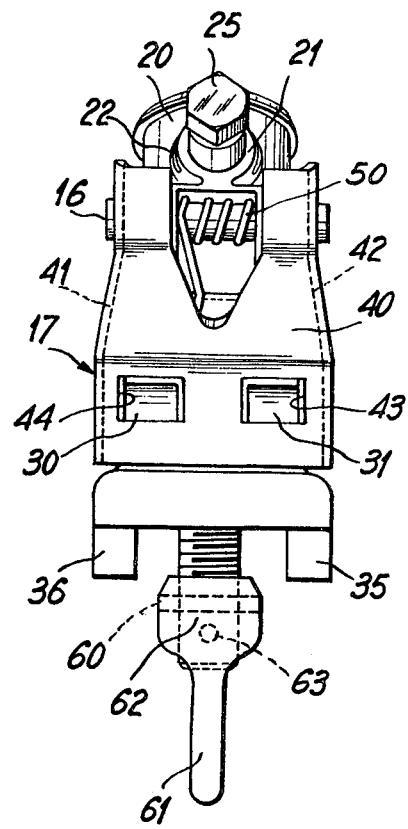
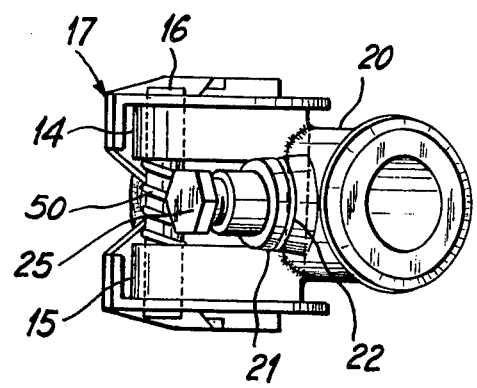

HOT LINE CLAMPS

This is a continuation, of application Ser. No. 546,753, filed Feb. 3, 1975 now abandoned.

The present invention relates generally to electrical clamps or connectors used to connect a branch line or conductor to an elevated low or medium voltage main power line or conductor.

It has already been proposed to carry out such an operation with mechanical squeeze clamps having a C-shaped body with a pressure member which is movably mounted between a low released position and a high tightened position in the body, such a pressure member being operated by means of the insulated pole temporarily secured therewith.

The above-mentioned pressure member is formed as a an eye bolt adapted to receive the hook at the free end of an insulated pole or clamping stick.

Generally speaking, the body of the clamp comprises a cavity adapted to receive by insertion an end of a branch conductor which is then fixed in place in the cavity by means of a pressure screw in association with a pressure pad.

Such an operation is carried out on the ground and the end of the branch conductor which is covered with an insulator is stripped along a suitable length.

In the conductors of the present type it has also been proposed to provide a plug-in part.

Such clamps essentially comprise a base member forming a first jaw through which freely traverses a pressure screw and which in turn is screwed into a second jaw which is held against rotation relative to the first jaw.

The turning of the pressure screw causes the jaws to come together which clamps the main power line.

A major drawback of such a clamp, especially one which is adapted to be in continuous outdoor operation, is that the open C-shaped body is constantly subjected to very high bending forces produced by the force exerted by the pressure screw tending to open the body of the clamp.

Accordingly the body must be generously dimensioned to achieve a sufficient reliability which is one of the important characteristics of medium voltage line electrical clamps.

So called hot line clamps of this type of elementary construction lack means for retaining, during sliding movement, the upper and lower jaws, and the pressure exerted by the jaws on the main power line are thereby disoriented with respect to the pressure screw which is thus subjected to considerable bending forces which are incompatible with a long service life.

Another drawback of known hot line clamps resides in the fact that as long as the pressure screw does not exert its tightening force on the main power line, the branch line can come off the main line particularly during tightening.

Such circumstances can lead to very serious accidents owing to the fact that the lineman is most often directly below the branch line when putting it in operative position on the main line.

Furthermore, in present-day devices the tightening of the pressure screw is effected by a lineman and the tightening couple exerted on the pressure screw varies substantially as a function of divers factors, namely the physical strength of the lineman and his position relative to the main line overhead.

It is therefore particularly interesting to be able to set the predetermined maximum allowable couple or torque beforehand without the lineman having to do this himself and without having recourse to overly complex arrangements employing devices which are triggered upon a predetermined torque between the insulating pole and the clamp being reached.

After being installed, such a device should also offer the possibility of being able to remain in place on the main line with the maximum permissible torque applied, or being removed; and in any event, it should eliminate any chance that the clamp could break under the maximum applied force, causing it to fall from the main line seriously injuring the lineman at work there below.

An object of the present invention is to overcome the above-mentioned drawbacks and to this end, proposes a hot line clamp which, in addition to being simple in construction and sturdy, is particularly practical in operation compared to known hot line clamps.

An aspect of the invention consists in an electrical clamp for connecting a branch conductor to a main conductor comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, an operating member for applying force for rocking said flap member to its closed position and for turning the threaded pressure applying member for tightening and loosening its hold on the main conductor, and torque limiting means connected between the operating member and the threaded member for preventing the threaded member form exerting a tightening force on the main conductor above a predetermined limit.

Such a hot line clamp has the advantage of being practical and reliable in operation as well as of simple construction.

Indeed, the automatic operation of the flap member is ensured by the weight of the insulated pole alone; moreover the maximum allowable tightening couple exerted by the pressure screw is not left up to the discretion of the lineman but is predetermined by the torque limiting means.

According to a preferred feature the torque limiting means is a calibrated pin fixing the threaded pressure applying member to the operating member.

According to another preferred feature a second pin is associated with the threaded member which enables the unscrewing thereof in case too great a tightening torque shears the pin interconnecting the threaded member with the operating member.

According to another feature the flap member is provided with two lateral flanges oriented perpendicular to the axis of rocking movement of the flap member cutout of the edge thereof.

It has been found that such an arrangement of simplified construction leads to the desired fastening of the branch line to the main line; the former may be easily disconnected in case excessive tightening causes the severing of the first pin limiting the tightening torque.

Furthermore, there is no possibility of the hot line clamp falling off the main line, even upon the pin severing, which very substantially improves the safety factor of such a clamp.

Other features and advantages will be brought out in the description which follows by way of example with reference to the accompanying drawings, in which:

FIG. 1 is a perspective view of a form of the invention viewed from beneath;

FIG. 2 is also a perspective view of the body of the hot line clamp;

FIG. 3 is an elevation view of a hot line clamp in position on a power line;

FIG. 4 is a plan view corresponding to FIG. 3;

FIG. 5 is a view taken from the direction of the arrow F in FIG. 3; and

FIG. 6 is a perspective view the arrangement of the torque limiter.

In the embodiment of the invention illustrated in the drawing the hot line clamp comprises a metal body 10 of generally U-shaped configuration having an interconnecting base or bight portion 11 disposed between legs 12, 13 of the U-shaped body.

The leg 12 forms two clevises 14, 15 adapted to receive a hinge pin 16 for pivotally or rockably mounting a flap member globally designated by reference 17.

A cylindrical boss 20 is disposed on the outer face of the base or bight portion; the axis of the cylindrical boss may be of any desired orientation depending on particular use requirements.

A radial projection 21 is formed on the boss and includes a transverse slot 22 and a tapped hole 23 adapted to threadedly receive a threaded pressure applying bolt or member 25.

An interior chamber 26 (see FIG. 3) is formed inside the boss 20; the threaded member 25 extends into this chamber and is adapted to hold the stripped end of the branch conductor CD intimately in contact with a well thereof.

Two dogs 30 whose function will be brought out hereinafter are formed at the free end of leg 13.

The leg 13 defines a groove 34 forming a tongue 13A; the tongue and leg each have a tapped hole 32; two depending portions 35, 36 facing each other extend from the leg 13.

The flap member 17 is formed of sheet metal and has a front face 40 (FIG. 5) with two side flanges 41, 42 bent at right-angles thereto.

Two openings 43, 44 are formed in the front face of the flap member adapted to cooperate with dogs 30, 31 on the body 10.

The side flanges are cut out so that the edges 45, 46 from an angle less than 90°, at least one of the edges 45, 46 forming camming means cooperable with the main line CP shown in dash-dotted lines.

The flap member 17 is rockably mounted on the pin 16 facing the body and biased under the action of the spring 50 (FIG. 5) receiving the pin 16; one end 51 of the spring 50 bears against the interior face of the flap member and the other end 52 thereof also bears against the body 10.

The spring 50 is constructed and arranged to exert a force on the flap member 17 to urge the latter toward its open position away from the leg 13.

The tapped hole 32 in the leg 13 threadedly receives a threaded member indicated generally by reference 56.

A pressure shoe 58 is provided at the end of the threaded member disposed between the legs 13, 14 of the body and is freely mounted for rotation by means of rivet 59.

A calibrated pin 60 connects the other end of the threaded member or bolt 56 to an eye head or ring 61 with a collar 62 threadedly receiving the threaded pressure applying member or bolt.

Such a pin is held in place by expanding the body of the pin and force fitting it into its housing.

A second pin 63 which may have a diameter slightly greater than that of the first pin 60 is put into position at the end of the bolt 56 beyond the underface 64 of the collar 62 in such a direction so that its axis is preferably, though not necessarily, oriented substantially at right-angles to the first pin.

The second pin 63 is put into position after the first so that its ends extend beyond the periphery of the pressure bolt and so that its top side is in the immediate vicinity of the underface 64 of the collar 62 of the ring.

As with the first pin, the second pin is held in place in the pressure bolt by expanding the body of the pin and force fitting it in the bolt or even by means of any suitable adhesive material.

The operation of the hot line clamp thus described may be as follows.

The pressure bolt 56 being unscvewed as far as possible, the flap member 17 is in its open or raised position by reason of the spring 50 (see FIG. 1 in particular).

The branch line (not shown here) is positioned on the ground by inserting the stripped free end thereof in the chamber 26 in the boss and is held firmly in position by tightening the corresponding pressure screw.

With the branch line firmly secured to the hot line clamp, the ring 61 of the clamp is hooked on the insulated pole (not shown) and is lifted over the main line CP so that the opening between the lower end of the flap member 17 and the ends of the dogs 30, 31 are both above the main power line.

The clamp is then lowered until the edges 45, 46 of the side flanges 41, 42 on the flap member come to bear against the main power line.

Under the effect of the weight of the insulated pole, the flap member is rocked in the direction of the arrow F (FIG. 1) in oposition to the force exerted by the spring 50, and the openings 43, 44 in the flap member 17 lock into place on the dogs 30, 31 of the body.

After this, the lineman turns the pressure bolt 56 by rotating the insulated pole until the pressure shoe 58 engages the main power line at which point the tightening phase per se begins.

It should be noted that the pressure shoe is net rotated by the pressure screw because the pressure shoe cooperates with a corresponding portion of the body which thus forms guiding means for the pressure shoe.

The concave surface 58A of the pressure shoe is therefore always suitably oriented opposite the main power line.

The tightening phase in thus effected manually and the pressure shoe continues to urge the conductor against the edges of the flat member until the desired degree of clamping is achieved.

If the lineman excessively tightens the pressure applying bolt 56, the calibrated pin 60 will eventually be sheared and the operative connection between the ring and the pressure bolt severed. Furthermore, this occurrence is clearly perceived by the lineman whose effective efforts are abruptly diminished to zero.

The shearing of the pin 60 in no way damages the junction of the clamp of the main line CP, so that nothing prevents the clamp remaining in position as it is. Further, it is obvious that the shearing of the pin cannot in any event cause the clamp or the insulated pole to fall resulting in an accident.

On the other hand, if the lineman so desires he may exert a couple or tonque in the opposite direction on the ring 61 until the pin 63 comes into contact with the underside 64 of the coller 62 of the ring, fixing the ring the pressure bolt 56.

By continuing this unscrewing operation with the insulated pole, the lineman can remove the clamp by fully unscrewing the pressure bolt 56 and then slightly lifting the clamp thereby taking the edges 45, 46 of the flap member 17 out of engagement with the main power line, thus causing the automatic opening of the flap member 17 under the action of the return spring 50 in order to enable the removal of the clamp from the main power line CP.

It is also noted that, for reasons of safety, it is preferable for the pin 63 which is used in case the safety pin has been sheared off by excessive tightening to remove the clamp from the power line to be slightly larger in diameter than the safety pin since there is always a possibility of jamming which might warrant the application of an untightening torque greater than the maximum allowable tightening torque.

It should be pointed out that the slits 22 are adapted to prevent in a simple and conventional manner the unscrewing of the bolts 23, 56 by dissipating the effect of vibrations on the main power line on which the clamp is in service.

Likewise the possibility of filling the branch line chamber with grease and protecting the chamber with a fluidtight cover of suitable material exist. The location of the branch line chamber is given by way of example; this chamber could be oriented otherwise to permit, for example, the reception of the branch line from either end. In this case the chamber is formed as a hollow member with open ends filled with grease and protected on its ends by an elastic frustoconical cap which is fluidtight on the cable end ans by a flat cover of elastomeric material at the end opposite the branch line.

It is interesting to note that after a safety pin has been sheared and removed from the clamp the device has in now way been damaged, and it suffices to replace the safety pin in order to put the device into full operative condition.

The present invention is of course not limited to the disclosed embodiment but on the contrary includes all variations and alternatives with in the scope and spirit of the invention.

What we claim is:

1. An electrical clamp for connecting a branch conductor to a main conductor, comprising a rigid generally U-shaped body having a pair of opposed legs, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, a pair of camming surfaces on said flap member disposed one on either side of said one leg and adapted to cooperate with the main conductor when the clamp is received on the main conductor for rocking said flap member to the closed position before tightening the hold on the main conductor, threaded pressure applying means threadedly received in one leg of said body and in unobstructed facing relation with the other leg of said body for movement towards and away from said body for movement towards and away from said other leg for respectively tightening and loosening the hold of the clamp on the main conductor with the main conductor in direct clamping contact with said one leg and said pressure applying means, and an operating member for applying force for rocking said member to its closed position and disposed on said threaded pressure applying member having a first mode of operation for exerting an axial force through said threaded pressure applying member to said flat member, for automatically rocking the latter to its closed position and a second mode of operation for turning the threaded pressure applying member for tightening and loosening its hold on the main conductor.

2. An electrical clamp as claimed in claim 1, and torque limiting means connected between the operating member and the threaded member for preventing the threaded member from exerting a tightening force on the main conductor above a predetermined limit.

3. An electrical clamp for connecting a branch conductor to a main conductor comprising a rigid generally U-shaped body, means for securing a branch conductor on said body, a flat member rockably mounted about one leg of said U-shaped body between an open position for enabling the clamp to be received on a main conductor and a closed position for maintaining the clamp in place on the main conductor, resilient means biasing the flap member toward the open position, camming means on said flat member adapted to cooperate with the main conductor when the clamp is received on the main conductor for rocking said flap member to the closed position, threaded pressure applying means threadedly received in said body for tightening and loosening the hold of the clamp of the main conductor, an operating member for applying force for rocking said flap member to its closed position and for turning the threaded pressure applying member for tightening and loosening its hold on the main conductor, and torque limiting means connected between the operating member and the threaded member for preventing the threaded member from exerting a tightening force on the main conductor above a predetermined limit, said flap member being rockably mounted about a pivot on said one leg, said one leg having a clevis receiving the pivot, one end of said resilient means being received in one part of the clevis, and the other end of said resilient means bearing against the flap member.

4. An electrical clamp for connecting a branch conductor to a main conductor comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, an operating member for applying force for rocking said flap member to its closed position and for turning the threaded pressure applying member for tightening and loosening its hold on the main conductor, and torque limiting means connected between the operating member and the threaded member for preventing the threaded member from exerting a tightening force on the main conductor above a predetermined limit, the camming means comprising the free edge of at least one flange formed on the flap member, there being two flanges provided on the flap member, the flap member being formed of sheet metal and the flanges being bent-over portions with edges having rounded angles less than about 90°.

5. An electrical clamp for connecting a branch conductor to a main conductor comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, an operating member for applying force for rocking said flap member to its closed position and for turning the threaded pressure applying member for tightening and loosening its hold on the main conductor, torque limiting means connected between the operating member and the threaded member for preventing the threaded member from exerting a tightening force on the main conductor above a predetermined limit, said threaded member threadedly engaging the other leg of said U-shaped body and being displaceable between the legs of said body, a pressure shoe freely mounted on an end of the threaded member opposite the operating member, means for preventing the turning of the pressure shoe when the threaded member is tightened and loosened, said operating member being a ring adapted to receive an insulating pole and having a threaded collar fixed to said threaded member by said torque limiting means, said torque limiting means comprising a pin having a predetermined shear strength, and a second pin fixed to said threaded member immediately below the collar.

6. An electrical clamp for connecting a branch conductor to a main conductor comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, an operating member for applying force for rocking said flap member to its closed position and for turning the threaded pressure appling member for tightening and loosening its hold on the main conductor, and torque limiting means connected between the operating member and the threaded member for preventing the threaded member from exerting a tightening force on the main conductor above a predetermined limit, the flap member being provided with at least one opening adapted to cooperate with a dog formed on the other leg of the U-shaped body for latching the flap member in its tightened position.

7. An electrical clamp for connecting a branch conductor to a main conductor, comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, latch means acting between said body and said flap member releasably to retain said flap member in said closed position, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, and an operating member disposed on said threaded pressure applying member having a first mode of operation for exerting an axial force through said threaded pressure applying member to said flap member for rocking the latter to its closed position and a second mode of operation for turning the threaded pressure applying member for tightening and loosening its hold on the main conductor.

8. An electrical clamp for connecting a branch conductor to a main conductor comprising a rigid generally U-shaped body, means for securing a branch conductor on said body, a flap member rockably mounted about one leg of said U-shaped body between an open position for enabling the clamp to be received on a main conductor and a closed position for maintaining the clamp in place on the main conductor, resilient means biasing the flap member toward the open position, camming means on said flap member adapted to cooperate with the main conductor when the clamp is received on the main conductor for rocking said flap member to the closed position, threaded pressure applying means threadedly received in said body for tightening and loosening the hold of the clamp on the main conductor, an operating member for applying force for rocking said flap member to its closed position and for turning the threaded pressure applying member for tightening and loosening its hold on the main conductor, and torque limiting means connected between the operating member and the threaded member for preventing the threaded member from exerting a tightening force on the main conductor above a predetermined limit, said flap member being rockably mounted about a pivot on said one leg, said one leg having a clevis receiving the pivot, one end of said resilient means being received in one part of the clevis, and the other end of said resilient means bearing against the flap member, wherein said body is formed of cast metal and said means for securing a branch conductor comprises a boss projecting from the U-shaped body, said boss having an internal cavity for receiving the branch conductor.

* * * * *